April 12, 1960

E. W. HEROLD 2,932,735

TRANSISTOR FREQUENCY CONVERTER CIRCUITS

Filed Oct. 17, 1956

INVENTOR.
EDWARD W. HEROLD

BY H. [signature]

ATTORNEY

United States Patent Office 2,932,735
Patented Apr. 12, 1960

2,932,735

TRANSISTOR FREQUENCY CONVERTER CIRCUITS

Edward W. Herold, Princeton, N.J., assignor to Radio Corporation of America, a corporation of Delaware Application October 17, 1956, Serial No. 616,531

9 Claims. (Cl. 250—20)

Figure 1:
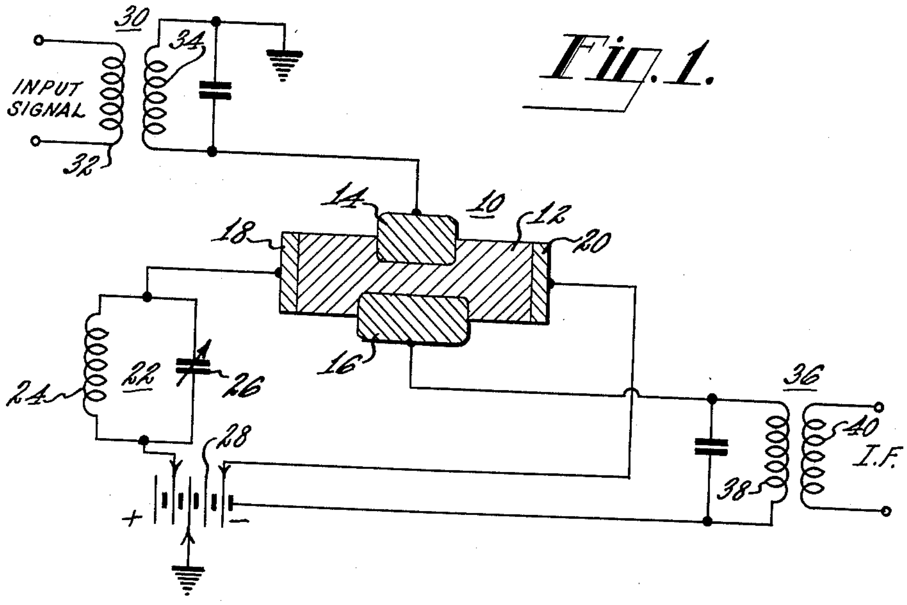

This invention relates to transistor frequency converter circuits suitable for use in superheterodyne signal receiving systems and the like.

Conventional signal receiving systems of the superheterodyne type require some means for converting the received modulated carrier wave into a corresponding intermediate frequency wave. Frequency converter circuits for accomplishing this type operation may include an oscillator for developing a beat frequency wave or local oscillator signal, and a mixer for mixing the local oscillator signal with the received carrier wave. The oscillator may include one electron discharge tube or transistor, while the mixer may include another and separate electron discharge tube or transistor. Alternatively, a frequency converter may consist of a single electron discharge tube of the pentagrid type or a single transistor in which separate oscillator and mixer sections are coupled together. The conventional single transistor frequency converter circuits generally require the provision of external feedback paths to generate the local oscillator signal.

It is an object of the present invention to provide an improved and simplified frequency converter circuit having a single semi-conductor device or transistor for developing a local oscillator signal and mixing the developed signal with an applied carrier wave to produce a desired intermediate or beat frequency signal.

It is another object of the present invention to provide an improved frequency converter circuit having a single transistor which operates in a stable manner to provide signal conversion of a received carrier wave to a beat or intermediate frequency signal without the use of external feedback paths.

In accordance with the invention, frequency conversion is obtained with the use of a single semi-conductor device or transistor which may be considered to be a combination of a filamentary type transistor, that is a transistor having at least two spaced ohmic electrodes and a rectifying electrode located in the region between the ohmic electrodes, and an ordinary three electrode junction transistor. The device comprises a semi-conductive body having two non-rectifying ohmic electrodes and a pair of semi-conductive junction electrodes. The two ohmic electrodes and one of the junction electrodes operate as a filamentary transistor, the two ohmic electrodes being the base and collector electrodes and the one junction electrode serving as the emitter. Both junction electrodes and one of the ohmic electrodes operate as an ordinary junction transistor, the junction electrodes being the emitter and collector and the ohmic electrode being the base. To generate the local oscillator signal, the filamentary type transistor portion of the composite device is properly biased to obtain a negative resistance characteristic in either the base or the emitter circuit. By virtue of this negative resistance characteristic, oscillations are generated without the provision of external feedback paths. The carrier wave input signal is applied between the base and emitter electrodes of the junction transistor, which heterodynes or mixes the input signal with the generated oscillator signal to provide a beat or intermediate frequency signal which may be derived from the collector.

Figure 2:
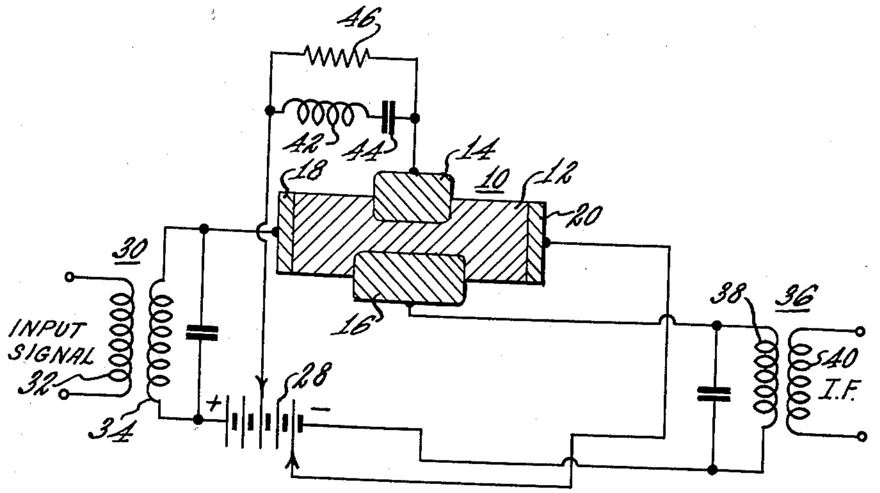

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1 and 2 are schematic circuit diagrams of frequency converter circuits embodying the invention.

Referring now to the drawing, wherein like parts are indicated by like reference numerals in both figures, and referring particularly to Figure 1, a frequency converter circuit embodying the invention has for its active element a semi-conductor device or transistor 10 which includes a body 12 of semi-conductive material, for example, germanium, silicon, or the like. The semi-conductive body 12 may be considered to be, for the purposes of explaining the invention, of N type conductivity although a P type semi-conductive body could be used. If P type semi-conductive material is used, the polarity of the biasing voltages would have to be reversed.

The transistor 10 includes a pair of rectifying electrodes 14 and 16, such as P–N junction or metal-to-semiconductor electrodes which may be formed in any suitable well known manner. One of these junction electrodes, 16, will be assumed to be the collector junction electrode and may be of larger area than the other junction electrode 14 to improve the collector electrode efficiency. The smaller area junction electrode, namely the electrode 14, will serve as the emitter electrode for both the filamentary transistor and the junction transistor. The transistor 10 also includes a pair of non-rectifying electrodes 18 and 20 which are soldered or otherwise attached in ohmic contact to opposite ends of the semiconductive body 12.

The semi-conductor device or transistor 10 may be considered to comprise two transistors, one of which is of the so-called filamentary type and includes the electrodes 14, 18, and 20 which are emitter, base, and collector electrodes, respectively. The other transistor of the composite device is of the ordinary junction type and includes the electrodes 14, 16, and either the electrode 18 or electrode 20 which are emitter, collector, and base electrodes, respectively. Either ohmic electrode 18 or 20 may serve as the base electrode of the junction transistor from an alternating current signal standpoint. In the present example, the electrode 18 will be considered to be the base electrode of the junction transistor, so that the base and emitter electrodes of the filamentary transistor, and the corresponding electrodes of the junction transistor are the same. The collector electrodes, however, differ.

A filamentary type transistor exhibits, under proper operating conditions, a voltage controlled negative resistance characteristic in its base electrode circuit. Thus, the base current will decrease as the base voltage increases over a portion of the operating range of the filamentary transistor. This negative resistance characteristic is used to supply the losses of a tuned circuit, such as the parallel resonant circuit 22 which is connected with the base electrode 18. The parallel resonant circuit 22 includes an inductor 24 and a variable tuning capacitor 26 for tuning the circuit 22 to the desired oscillator frequency.

To supply biasing potentials for the semi-conductor device 10, a direct-current supply source, such as illustrated by a battery 28, is provided. The battery 28 has an intermediate positive terminal connected to a point of reference potential such as ground. To provide biasing potentials for the ohmic base electrode 18, another intermediate positive terminal of the supply battery 28 is connected through the inductor 24 of the parallel resonant circuit 22 to the base electrode 18. A terminal of the battery 28 closer to the negative end than either of the positive terminals mentioned above, supplies biasing potential to the other ohmic electrode 20.

As was mentioned hereinbefore, the semi-conductor device or transistor 10 may be considered to comprise two transistors, one of these, the filamentary transistor comprising the electrodes 14, 18, and 20, serves as the local oscillator circuit to generate oscillations at a frequency determined by the parallel resonant circuit 22. The second transistor, of the ordinary junction type, serves, on the other hand, as a mixer to heterodyne or mix the generated oscillator signal with a received signal. The received signal, which may be a modulated carrier wave, is applied to the emitter 14 of the junction transistor. To this end, an input circuit 30, which includes a coupling transformer having a primary winding 32 and a tuned secondary winding 34 is coupled with the emitter 14. The carrier wave signals which are applied through the input circuit 30 are thus coupled between the emitter 14 and the base 18 of the junction transistor. Output signals are derived from the secondary winding 40 of an output circuit 36, which also includes a tuned primary winding 38. One end of the primary winding 38 is connected with the collector electrode 16, while the other end is connected directly with the negative terminal of the battery 28. The collector electrode 16 of the three electrode junction transistor thus receives biasing potentials of proper polarity to bias it in the reverse, relatively non-conducting direction. However, it is necessary to adjust the geometry of the device, in that the actual potential of the semi-conductor N-type bar at the point of electrode 16 is determined both by the potential applied between the electrodes 18 and 20, and by the relative distance of the electrodes from each other. In some instances, the battery terminal of the electrode 20 may be the same as that of the electrode 16. The generated oscillator signals are heterodyned or mixed with the signals which are applied to the input circuit 30 by the junction transistor which comprises the electrodes 14, 16, and 18. The output signals which appear in the collector or output circuit 36 of the junction transistor will thus contain one or more of the sum and difference frequencies of the carrier wave signal and the local oscillator signal, and the other modulation components as well. One or more of these components is chosen for the tuning of the output circuit 36. In a superheterodyne receiver, the chosen component is the intermediate frequency (IF).

A filamentary transistor also exhibits, under proper operating conditions, a current-controlled negative resistance characteristic in its emitter circuit. Thus, the emitter voltage will decrease as the emitter current increases over a portion of the operating range of a filamentary transistor. This emitter circuit negative resistance characteristic may also be used to generate oscillations without the provision of an external feedback path. This characteristic of the filamentary transistor is used, in the embodiment of the invention illustrated in Figure 2, by connecting a series resonant circuit, comprising an inductor 42 and a capacitor 44, with the emitter junction electrode 14 of the semi-conductor device or transistor 10. To supply forward bias for the emitter electrode 14, it is also connected through a stabilizing resistor 46 to an intermediate positive terminal of the biasing battery 28.

In the embodiment of the invention illustrated in Figure 2, the received signal such as a carrier wave signal is applied through the input circuit 30 between the base 18 and the emitter 14. To this end, the tuned secondary winding 34 of the input circuit 30 is connected between the base 18 and the positive terminal of the supply battery 28. A point near the negative terminal of the battery 28 is connected directly with the ohmic connection 20 of the transistor 10 (i.e., to the collector electrode of the filamentary transistor) and supplies operating biasing potentials thereto. The output circuit connection is identical to the one illustrated in Figure 1 and includes the output circuit 36 which is connected for deriving output signals between the collector 16 and the base 20. In operation, the local oscillator signal generated by virtue of the current controlled negative resistor characteristic in the emitter electrode 14 circuit of the filamentary transistor is heterodyned or mixed with the applied input signal in the junction transistor portion of the composite device. The output signal which appears in the collector or output circuit 36 of the device 10 will thus contain one or more of the usual sum and different frequencies of the carrier wave signal and the local oscillator signal, and the other modulation components as well. In the present example, it is assumed that the output circuit 36 is tuned to the usual difference-frequency intermediate-frequency signal.

Frequency converter circuits embodying the invention are characterized by the simplicity of their circuit connections, particularly since external feedback paths are eliminated, and by relatively stable circuit operation. Accordingly, these circuits are adapted for use with frequency converters in superheterodyne signal receiving systems.

What is claimed is:

1. A frequency converter circuit comprising, in combination, a composite semi-conductor device including a single semi-conductive body having electrodes associated therewith to provide a three electrode filamentary transistor and a three electrode junction transistor, said filamentary transistor exhibiting a negative resistance characteristic over a portion of its operating range, circuit means connected with said filamentary transistor and operative with said negative resistance characteristic to provide an oscillator circuit for generating an oscillator signal without an external feedback circuit, signal input circuit means connected with said junction transistor for applying an input signal thereto for mixing with said oscillator signal, and output circuit means connected with said junction transistor for deriving therefrom an output signal representative of a modulation component of said input signal and said oscillator signal.

2. A frequency converter circuit comprising, in combination, a composite semi-conductor device including a common semi-conductive body with emitter and collector junction electrodes and a pair of ohmic electrodes, the emitter and pair of ohmic electrodes providing with said semi-conductive body a first three electrode filamentary transistor having a negative resistance characteristic over a portion of its operating range, a local oscillator circuit including a tuned circuit connected with one of the electrodes of said first transistor and operative with said negative resistance characteristic therewith to generate a local oscillator signal, said first transistor being connected to operate as the active element of said local oscillator circuit, said emitter and collector electrodes and one of said ohmic electrodes providing with said semi-conductive body a second three electrode transistor, said second transistor being connected to operate as a signal mixer, signal input circuit means connected for applying a carrier wave signal between two of the electrodes of said second transistor for heterodyning with said local oscillator signal, and signal output circuit means connected with said second transistor for deriving an output signal representative of a modulation component of said local oscillator signal and said carrier wave signal.

3. A frequency converter circuit comprising, in combination, a composite semi-conductor device including an emitter and a collector junction electrode and a pair of ohmic electrodes, said emitter and collector junction electrodes and one of said ohmic electrodes being connected to operate as a three electrode junction transistor and said emitter electrode and said pair of ohmic electrodes being connected to operate as a three electrode transistor of the filamentary type having a negative resistance characteristic over a portion of its operating range, a resonant circuit connected with one of said ohmic and emitter electrodes and operative with the negative resistance characteristic of said filamentary transistor to generate a local oscillator signal at the frequency of said resonant circuit, said oscillator being operative without external feedback means, signal input circuit means connected for applying a carrier wave signal between said emitter electrode and said one of said ohmic electrodes for heterodyning in said junction transistor with said local oscillator signal, and signal output circuit means connected for deriving an output signal representative of a modulation component of said local oscillator signal and said carrier wave signal from said collector electrode.

4. A frequency converter circuit as defined in claim 3 wherein said negative resistance characteristic is voltage controlled, and wherein the circuit provided by said one of said ohmic electrodes and said resonant circuit is parallel resonant at the frequency of said generated oscillator signal.

5. A frequency converter circuit as defined in claim 3 wherein said negative resistance characteristic is current controlled, and wherein the circuit provided by said emitter electrode and said resonant circuit is series resonant at the frequency of said generated oscillator signal.

6. A frequency converter circuit for signal receiving systems and the like comprising, in combination, a composite semi-conductor device including a single semi-conductive body, a first and a second non-rectifying electrode connected respectively to opposite ends of said body, a first and a second junction electrode disposed on said body, means including a direct current supply source for biasing said electrode whereby said first and second non-rectifying electrodes and said first junction electrode are the base, collector, and emitter electrodes respectively of a filamentary type transistor having a voltage controlled base electrode negative resistance characteristic and said first and second junction electrodes and said first non-rectifying electrode are the emitter, collector, and base electrodes respectively of a junction transistor, a parallel resonant circuit connected at one end to said first non-rectifying electrode to operate with said negative resistance characteristic to provide a local oscillator signal, said oscillator being operative without external feedback means, direct-current conductive means connecting said supply source between the other end of said parallel resonant circuit and said second non-rectifying electrode, signal input circuit means connected with said first junction electrode for applying a carrier wave signal thereto for mixing with said local oscillator signal in said junction transistor, and output circuit means connected with said second non-rectifying electrode and said second junction electrode for deriving an output signal therefrom representative of a modulation component of said local oscillator signal and said carrier wave signal.

7. A frequency converter circuit for signal receiving systems and the like comprising, in combination, a composite semi-conductor device including a single semi-conductive body, a first and a second non-rectifying electrode connected respectively to opposite ends of said body, a first and a second junction electrode disposed on said body, means including a direct current supply source for biasing said electrodes whereby said first and second non-rectifying electrodes and said first junction electrode are the base, collector, and emitter electrodes respectively of a filamentary type transistor having a current controlled emitter electrode negative resistance characteristic and said first and second junction electrodes and said first non-rectifying electrode are the emitter, collector, and base electrodes respectively of a junction transistor, a series resonant circuit connected with said first junction electrode to operate with said negative resistance characteristic to provide a local oscillator signal, said oscillator being operative without an external feedback circuit, signal input circuit means connected with said first non-rectifying electrode for applying a carrier wave thereto for mixing with said local oscillator signal in said junction transistor, direct-current conductive means connecting said supply source between said second non-rectifying electrode and said signal input circuit means, means connecting said supply source with said first junction electrode, and output circuit means connected with said second non-rectifying electrode and said second junction electrode for deriving an output signal therefrom representative of a modulation component of said local oscillator signal and said carrier wave signal.

8. A frequency converter circuit for converting signals of one frequency to corresponding signals of another frequency comprising, in combination, a single semiconductor device having at least four electrode connections, three of said connections providing first emitter, first base and first collector electrodes of a first amplifying transistor exhibiting a negative resistance effect between said first emitter and base electrodes, two of said three connections and a fourth connection providing second emitter, second base and a second collector electrodes of a second amplifying transistor, a resonant circuit connected to the electrodes of said first transistor and operative with said negative resistance characteristic to provide an oscillator circuit without external feedback means, means providing a signal input and a signal output circuit connected to the electrodes of said second transistor, and direct-current bias means connected to the electrodes of said first and second transistors.

9. A frequency converter circuit as defined in claim 8, wherein the emitter and base electrodes of said first transistor are the same as the emitter and base electrodes of said second transistor.

References Cited in the file of this patent

UNITED STATES PATENTS

| | | |
|---|---|---|
| Re. 24,183 | Wallace | July 17, 1956 |
| 2,569,347 | Shockley | Sept. 25, 1951 |
| 2,709,787 | Kircher | May 31, 1956 |
| 2,754,431 | Johnson | July 10, 1956 |

OTHER REFERENCES

"Electrons and Holes in Semiconductors," by Shockley, Van Nostrand Co., 1950, page 81.